United States Patent [19]

Iwasaki

[11] Patent Number: 5,814,890
[45] Date of Patent: Sep. 29, 1998

[54] THIN-TYPE SEMICONDUCTOR PACKAGE

[75] Inventor: Hiroshi Iwasaki, Yokohama, Japan

[73] Assignee: Kabushiki Kaisha Toshiba, Kawasaki, Japan

[21] Appl. No.: 396,234

[22] Filed: Mar. 1, 1995

[30] Foreign Application Priority Data

Mar. 2, 1994 [JP] Japan .................................. 6-032296

[51] Int. Cl.$^6$ .................................................. H01L 23/48
[52] U.S. Cl. ........................... 257/778; 257/737; 257/780
[58] Field of Search ..................................... 257/778, 780, 257/787, 790, 791, 48, 737, 738

[56] References Cited

U.S. PATENT DOCUMENTS

| | | | |
|---|---|---|---|
| 4,906,823 | 3/1990 | Kushima et al. | 228/245 |
| 5,065,227 | 11/1991 | Frankeny et al. | 257/778 |
| 5,269,453 | 12/1993 | Melton et al. | 228/180 |
| 5,381,307 | 1/1995 | Hertz et al. | 257/778 |
| 5,450,283 | 9/1995 | Lin et al. | 257/706 |
| 5,461,197 | 10/1995 | Hiruta et al. | 257/780 |

FOREIGN PATENT DOCUMENTS

| | | |
|---|---|---|
| 0520841 | 12/1992 | European Pat. Off. . |
| 2586885 | 3/1987 | France . |
| 3818894 | 12/1988 | Germany . |
| 59-125641 | 7/1984 | Japan . |
| 1-143346 | 6/1989 | Japan .................................. 257/778 |
| WO 93/15521 | 8/1992 | WIPO . |

Primary Examiner—Tom Thomas
Assistant Examiner—Roy Potter
Attorney, Agent, or Firm—Finnegan, Henderson, Farabow, Garrett & Dunner, L.L.P.

[57] ABSTRACT

A semiconductor package comprises a resin type board or a ceramic type board having a wiring circuit including a connecting portion on a first main surface, a semiconductor chip mounted on the first main surface of the board in face-down relation, a sealing resin layer filled between the lower surface of the semiconductor chip and the upper surface of the board, and flat type external connecting terminals electrically connected to the semiconductor chip and formed on a second main surface of the board with constant pitches in a lattice shape. A fabrication method for fabricating a semiconductor package comprises the steps of aligning connecting bumps of a board with gold bumps formed at an electrode terminal portion of a semiconductor chip so as to place the semiconductor chip on the board, the board having a wiring circuit including connecting pads composed of gold being and flat type external connecting terminals, the wiring circuit being formed on a first main surface of the board, the flat type external connecting terminals being formed on a second main surface of the board, pressuring the aligned board and semiconductor chip so as to contact the connecting portions thereof, filling a sealing resin in a space formed between the upper surface of the board and the lower surface of the semiconductor chip, and curing the filled resin while pressuring the resultant structure so as to prevent the connecting portions from dislocating.

6 Claims, 4 Drawing Sheets

THIN-TYPE SEMICONDUCTOR PACKAGE

BACKGROUND OF THE INVENTION

1. Field of the Invention

The present invention relates to a semiconductor package and a fabrication method thereof, in particular, to a semiconductor package suitable for a card type external storage medium or the like and a fabrication method thereof.

2. Description of the Related Art

The size (length, width, and thickness) of a memory card that accommodates a semiconductor package having a memory function should be reduced. Thus, the semiconductor package should be thinly and compactly constructed in such a manner that it almost accords with the outer shape of a semiconductor chip.

To satisfy such thin construction (for example, requirement of a space of 1 mm or less), TAB (Tape Automated Bonding) method, flip-chip mounting method, COB (Chip on Board) method, and so forth are known. In addition, as an example of a thin type package, a module as shown in FIG. 1 is known. Referring to FIG. 1, a semiconductor chip 1 is mounted on a first main surface of a ceramic type circuit board 2. External connecting terminals 4 are connected to a second main surface of the circuit board 2 via through-holes 3. A region on which the semiconductor chip 1 is mounted is sealed with a mold resin layer 5. In FIG. 1, reference numeral 6 represents bonding wires.

However, in the case of the TAB method, the fabrication cost of carrier tapes is relatively high. Moreover, in the fabrication process, a metal mold and a boding tool corresponding to the package size are required. Thus, since the assembling cost relatively increases, this fabrication method is improper from cost point of view.

On the other hand, in the flip-chip mounting method and the COB method, it is difficult to provide KGN (Known Good Die). Chips cannot be easily burnt in. Since a semiconductor chip 1 to be used cannot be burnt in advance, the reliability thereof is low. In other words, before the semiconductor chip (IC chip) 1 is used, a defect thereof that will take place in future should be detected. This process is referred to as burn-in. Thus, without the burn-in process, after the semiconductor chip is packaged, a trouble may take place. Thus, in these methods, the reliability is low. To solve this problem, a repair or rework may be performed for the mounted semiconductor chip 1. Consequently, the assembling cost will increase. Moreover, in many situations, it is technically difficult to perform the repair and rework for the mounted semiconductor chip. In particular, when a semiconductor chip with a large number of connecting terminals is mounted corresponding to the COB method, it takes a long time to assemble the chip, thereby increasing the cost.

In the TAB method and the COB method, a wider mounting space is required than the flip chip mounting method. Thus, in the TAB method and the COB method, the semiconductor chip cannot be compactly mounted. On the other hand, when the one-side molded packaged module is used, in a conventional transfer mold process, the bonding wires will move or the connecting portions will dislocate, thereby decreasing the reliability and yield of the final products. Moreover, at present, the height of the bonding wires 6 can not be technically reduced to less then 0.1 mm. Thus, this limitation leads to a problem for accomplishing a thin type package. Furthermore, to connect the bonding wires 6 to the external connecting terminals, an extra space is required outside the semiconductor chip 1, thereby preventing it from being compactly constructed.

SUMMARY OF THE INVENTION

A first object of the present invention is to provide a thin type semiconductor package that allows the fabrication cost to decrease.

A second object of the present invention is to provide a thin type semiconductor package that has high reliability.

A third object of the present invention is to provide a thin type semiconductor package that allows the fabrication cost to decrease and that is suitable for a memory card or the like.

A fourth object of the present invention is to provide a thin type semiconductor package that has high reliability and that is suitable for a memory card or the like.

A fifth object of the present invention is to provide a fabrication method for fabricating a thin type semiconductor package at a low cost.

A sixth object of the present invention is to provide a fabrication method for fabricating a thin type semiconductor package that has high reliability.

A seventh object of the present invention is to provide a fabrication method for fabricating a thin type semiconductor package suitable for a memory card or the like at a low cost.

An eighth object of the present invention is to provide a fabrication method for fabricating a thin type semiconductor package that is suitable for a memory card or the like and that has high reliability.

A ninth object of the present invention is to provide a fabrication method for fabricating a thin type semiconductor package that has high reliability and high yield.

A first aspect of the present invention is a semiconductor package, comprising a board having a wiring circuit including a connecting portion on a first main surface, a semiconductor chip mounted on the first main surface of the board in face-down relation, a sealing resin layer filled between the lower surface of the semiconductor chip and the upper surface of the board, and flat type external connecting terminals electrically connected to the semiconductor chip and formed on a second main surface of the board with constant pitches in a lattice shape.

A second aspect of the present invention is a fabrication method for fabricating a semiconductor package, comprising the steps of aligning an electrode terminal portion of a semiconductor chip with connecting pads of a board so as to place the semiconductor chip on the board, the board having a wiring circuit including the connecting pads and flat type external connecting terminals, the wiring circuit being formed on a first main surface of the board, the flat type external connecting terminals being formed on a second main surface of the board with constant pitches in a lattice shape, securing the aligned board surface and the connecting portion of the semiconductor chip, filling a sealing resin in a space formed between the upper surface of the assembled board and the lower surface of the semiconductor chip, and curing the filled sealing resin.

A third aspect of the present invention is a fabrication method for fabricating a semiconductor package, comprising the steps of aligning connecting pads of a board with gold bumps formed at an electrode terminal portion of a semiconductor chip so as to place the semiconductor chip on the board, the board having a wiring circuit including connecting pads composed of gold being and flat type external connecting terminals, the wiring circuit being formed on a first main surface of the board, the flat type external connecting terminals being formed on a second main surface of the board, pressuring the aligned board and semiconductor chip so as to contact the connecting portions thereof, filling a sealing resin in a space formed between the upper surface of the board and the lower surface of the semiconductor chip, and curing the filled resin while pressuring the resultant structure so as to prevent the connecting portions from dislocating.

According to the semiconductor package of the present invention, a semiconductor chip (IC chip) is mounted on a main surface (one surface) of a resin type board or a ceramic type board. In this construction, since a mold sealing resin layer on a component mounting side is omitted, the semiconductor package is thinly and compactly constructed at low cost. In addition, external connecting terminals are formed on the other main surface side (non-component mounting side) of the board with constant pitches in a lattice shape so that standard sockets can be used.

In other words, since the mold sealing resin layer on the upper surface of the semiconductor chip is omitted, the semiconductor package is thinly constructed. In addition, the external connecting terminals are formed with the constant pitches in the lattice shape so as to provide a semiconductor package having many pins and high performance. Moreover, the reliability of the semiconductor package is improved and the cost thereof is reduced.

Next, the constant pitches and the lattice shape arrangement of the external connecting pins will be described.

As shown in FIG. 2, the arrangement of the external connecting terminals formed on the rear surface of the board are represented by the following equations.

$$m = INT[(h-2f)/a]+1$$

$$n = INT[(v-2f)/a]+1$$

where h represents the width of the board; v represents the length of the board; a represents pitches of the external connecting terminals; f represents the distance between the center of each of the outermost external connecting terminals and the corresponding edge of the board; m represents the number of the external connecting terminals in the horizontal direction of the board; n represents the number of the external connecting terminals in the vertical direction of the board; and INT is a function that rounds off the fraction part of a numeric value and obtains only the integer part.

In the fabrication process of the semiconductor package, as a simple means, when the connecting terminals of the board and the semiconductor chip are aligned and secured, the connecting terminals of the semiconductor chip that have been composed of for example conductive paste may be pressure-fitted or connected to the connecting terminals on the board.

According to the semiconductor package of the present invention, the semiconductor package is closely sealed by the mounted semiconductor chip itself. In other words, the semiconductor chip is mounted in face-down relation. Thus, the upper surface (rear surface) of the semiconductor chip contributes to packing and sealing the semiconductor chip. In addition, since the face-down side is sealed with resin, the semiconductor chip is securely packaged and sealed, it is protected and stabilized. Thus, a thin and compact semiconductor package can be easily accomplished. In addition, since the external connecting terminals are formed with constant pitches in a lattice shape, the arrangement thereof is standardized. Thus, regardless of the number of the external connecting terminals, predetermined tests and inspections can be performed through a socket with terminal pins formed with constant pitches in a lattice shape. Thus, the semiconductor package according to the present invention remarkably contributes to the improvement of the productivity and cost.

On the other hand, according to the fabrication method for fabricating a semiconductor package of the present invention, a sealing resin is filled in a space formed between the assembled board surface and the lower surface of the semiconductor chip. A sealing resin having a proper viscosity or a liquid type resin (for example, epoxy resin) may be used. Such a resin can be filled in the space by capillary action and then cured. In this case, a semiconductor package with high yield and high reliability can be accomplished without a damage of the semiconductor chip (for example, peeling of terminal connecting portions).

These and other objects, features and advantages of the present invention will become more apparent in light of the following detailed description of a best mode embodiment thereof, as illustrated in the accompanying drawings.

DESCRIPTION OF THE PREFERRED EMBODIMENTS

Next, with reference to FIGS. 3 to 13, embodiments of the present inventions will be described.

First Embodiment

Figure 1:
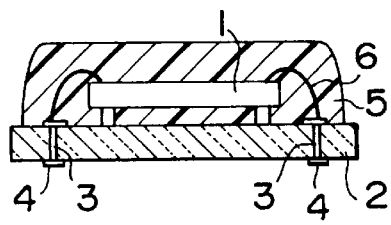
FIG. 1 is a sectional view showing a construction of a conventional semiconductor package.
Figure 2:
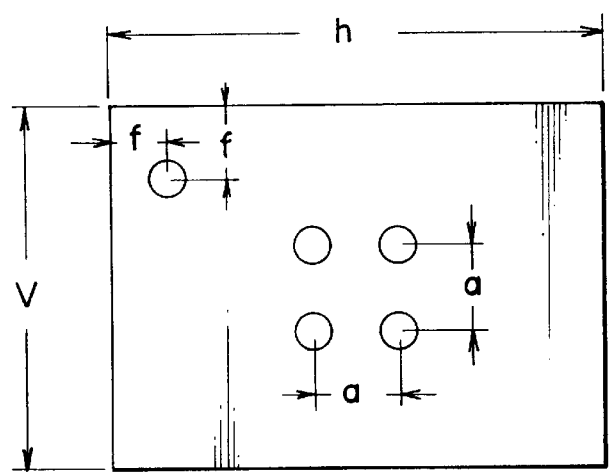
FIG. 2 is a schematic diagram showing a basic conception of the arrangement of external connecting terminals formed on the rear surface of a semiconductor package according to the present invention.
Figure 3:
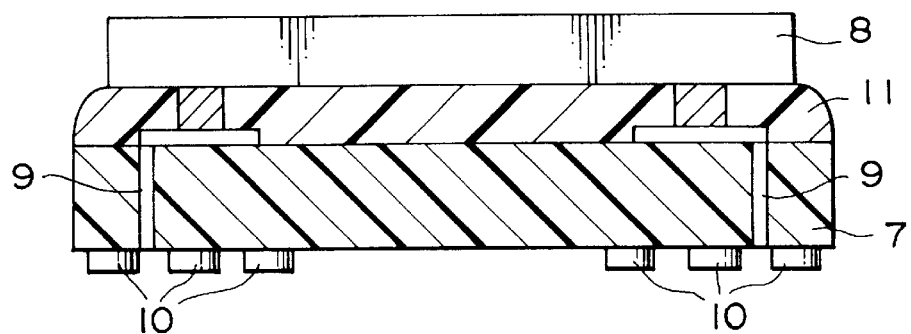
FIG. 3 is a sectional view showing a construction of principal portions of the semiconductor package according to the present invention.
Figure 4:
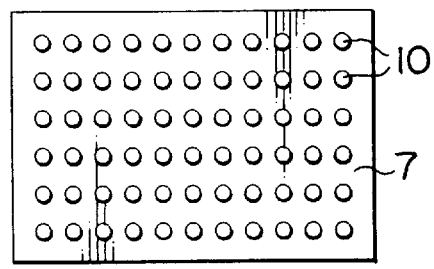
FIG. 4 is a bottom view showing the semiconductor package of FIG. 3.

FIG. 3 is a sectional view showing a construction of principal portions of a semiconductor package according to the present invention. FIG. 4 is a bottom view of the semiconductor package of FIG. 3. Referring to FIG. 3, the length and width of a circuit board 7 are 11.2 mm and 6.6 mm, respectively. On one main surface of the circuit board 7, a semiconductor chip (IC chip or the like) 8 is mounted. External connecting terminals 10 are formed on the other main surface of the circuit board 7 via through-holes 9 of the circuit board 7. The external connecting terminals 10 are formed with constant pitches (for example, 1 mm) in a lattice shape as shown in FIG. 4. A sealing resin layer 11 is filled in a space portion formed between the upper surface of the circuit board 7 and the lower surface of the semiconductor chip 8, thereby improving the strength of the entire semiconductor package.

Next, a fabrication method for fabricating the above-described semiconductor package will be described.

First, a resin type circuit board 7 is prepared. On a surface (a first main surface) of the resin type circuit board 7, wires including connecting pads for mounting a flip chip are formed. On the rear surface (a second main surface) of the resin type circuit board 7, flat type external connecting terminals 10 that are connected to the wires via the through-holes 9 are formed with constant pitches in a lattice shape. The length, width, and thickness of the resin type circuit board 7 are for example 11.2 mm, 6.6 mm, and 0.2 mm, respectively. The resin type circuit board 7 mounts a semi-conductor chip (IC chip) 8 in face-down relation. The length, width, and thickness of the semiconductor chip 8 are 9.2 mm, 4.6 mm, and 0.25 to 0.30 mm, respectively.

Thereafter, the resin type circuit board 7 is secured onto the stage of a screen printer with a vacuum sucking system. Connecting pads are formed on the connecting terminals on the board 7 corresponding to electrode pads of the semiconductor chip 8. With a metal mask having opening (for example, 150×150 $\mu$m) corresponding to the electrode pads (for example, 100×100 $\mu$m) of the semiconductor chip 8 to be mounted, a silver paste (for example, the particle diameter thereof is 1 $\mu$m and the viscosity thereof is 1000 ps) is screen-printed on the first main surface of the resin type circuit board so as to form connecting pads on the connecting terminal portion. The diameter and height of the connecting pads is 150 $\mu$m and around 80 $\mu$m, respectively.

Next, a semiconductor chip 8 is prepared. On electrode pads of the semiconductor chip 8, gold bumps are formed by an electroplating process. Alternatively, gold ball bumps are formed by a ball-bonding method. In this case, the height, length, and width of the gold ball bumps are for example 30 $\mu$m, 100 $\mu$m, and 100 $\mu$m, respectively.

On the first main surface of the resin type board 7, the connecting pads thereof are aligned with the connecting gold bumps of the semiconductor chip 8. Thereafter, the connecting portions of the resin type board 7 and the semiconductor chip 8 are pressured. Thus, at least the edge portions of the connecting bumps are inserted into the connecting pads. Consequently, the connecting pads and the connecting bumps are connected and thereby a semiconductor package is assembled. In this state, silver paste that composes the connecting pads is cured by heat. Thus, so-called flip-chip bonding process is finished. By the flip-chip bonding process, the semiconductor chip 8 is secured to the resin type board 7 and they are electrically connected. In the connecting process of the connecting portions, if the resin type board 7 may warp, a proper amount (for example, 0.1 mm$^3$ or less) of heat-curing resin (heat curing type bonding agent) is preferably coated on a portion free of the connecting pads. In this case, when the flip-chip bonding process is performed, the resin should be cured by heat.

Thereafter, a sealing process is performed using a sealing resin. A sealing resin is filled in a space portion formed between the lower surface of the semiconductor chip 8 and the upper surface of the resin type board by capillary action. In the selective resin process, the space portion is satisfactorily filled with the resin and part thereof should be formed on the side surfaces of the semiconductor chip 8. After the resin process is performed, the filled resin is cured (solidified) by heat or the like. Thus, the semiconductor package shown in FIG. 3 is formed. The semiconductor chip 8 of the semiconductor package is secured to the surface of the resin type board 7 with the filled resin layer 11. In addition, the semiconductor chip 8 is insulated from the resin type board 7 by the resin layer 11. On the other hand, although the upper surface of the semiconductor chip 8 is exposed to the outside, since silicon that composes the semiconductor chip 8 is solid and hard, the surface of the semiconductor package is well protected. Experimental results show that a problem of reliability or the like of the semiconductor package does not take place.

Second Embodiment

A semiconductor chip 8 is prepared. Connecting bumps (100 $\mu$m high) are formed on an electrode pad surface (100×100 $\mu$m) of the semiconductor chip 8 by selectively plating solder (for example, 63Sn-37Pb) or evaporating solder with a solder mask. In addition, a resin type board 7 is prepared. Connecting pads are formed on a main surface of the resin type board 7 by screen-printing solder paste. By a flip-chip bonder, the semiconductor chip 8 is aligned with a first main surface of the resin type board 7 and then temporarily secured. Thereafter, the resultant structure is loaded into a reflow furnace. In the reflow furnace, the resultant structure is heated at a temperature equal to or higher than a solder melting temperature (183° C.) and thereby the semiconductor chip 8 is secured to the resin type substrate 7.

Thereafter, in the same condition as the first embodiment, a resin is selectively filled in a space portion formed between the semiconductor chip 8 and the resin type board 7. Thus, a semiconductor package is fabricated. As with the first embodiment, the semiconductor package according to the second embodiment is thinly and compactly constructed and has high reliability and yield.

Third Embodiment

A resin type board (or alumina type board or an aluminum nitride type board) 7 is prepared. On a first main surface of the resin type board 7, a wiring circuit for mounting a flip chip having connecting pads composed of gold are formed. On a second main surface of the resin type board 7, flat type external connecting terminals are formed with constant pitches in a lattice shape. In addition, a semiconductor chip 8 is prepared. On an electrode pad surface of the semiconductor chip 8, gold bumps (30 $\mu$m high, 100 $\mu$m long, and 100 $\mu$m wide) are formed by an electroplating method (or ball boding method). Thereafter, on the state surface of a flip-chip bonder, the resin type board 7 and the semiconductor chip 8 are aligned with each other and placed. In this case, the resin type board 7 is vacuum-sucked so as to prevent the resin type board 7 from warping. Thereafter, the gold bumps on the electrode pad surface of the semiconductor chip 8 are aligned with the gold connecting pads of the resin type board 7. In this state, a load (pressure) is applied from the top of the semiconductor chip 8 so as to contact the gold connecting pads and the connecting portions of the gold bumps.

Thereafter, while the pressure is applied, in the same condition as that of the first embodiment, a sealing resin is selectively filled in a space formed between the resin type board 7 and the semiconductor chip 8. In the resin filling process, when the temperature is properly raised, the capillary action is accelerated, thereby easily filling the resin in the space. After the resin filling process is finished, while a load is applied to for example the semiconductor chip 8, the heating process is performed so as to cure the filled resin. Thus, a semiconductor package is fabricated. In the semiconductor package, the connecting portions (connecting pads and the gold bumps) are prevented from dislocating. On the other hand, while the connecting portions are contacted, the semiconductor chip 8 is secured to the resin type board 7.

In this embodiment, as the board 7, a resin type circuit board is used. However, the present invention is not limited to such a construction. Instead, within the scope and spirit of the present invention, various modifications are available. For example, instead of the resin type circuit board, an alumina type circuit board or an aluminum nitride type circuit board may be used. In addition, the size of the circuit board may vary corresponding to the size of a semiconductor chip to be mounted.

Figure 5:
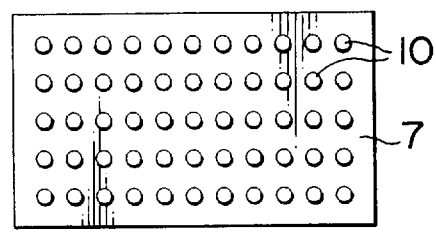
FIG. 5 is a bottom view showing another construction of principal portions of the semiconductor package according to the present invention.
Figure 6:
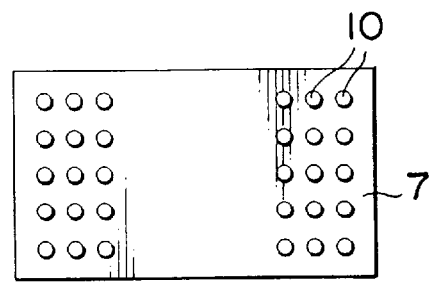
FIG. 6 is a bottom view showing another construction of principal portions of the semiconductor package according to the present invention.
Figure 7:
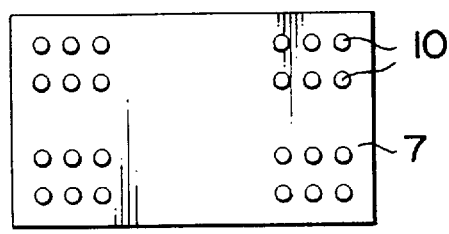
FIG. 7 is a bottom view showing another construction of principal portions of the semiconductor package according to the present invention.
Figure 8:
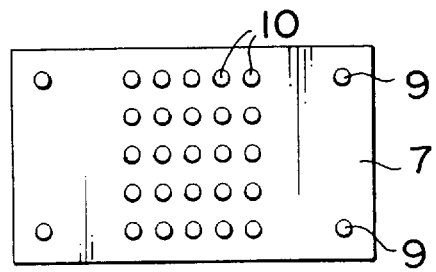
FIG. 8 is a bottom view showing another construction of principal portions of the semiconductor package according to the present invention.
Figure 9:
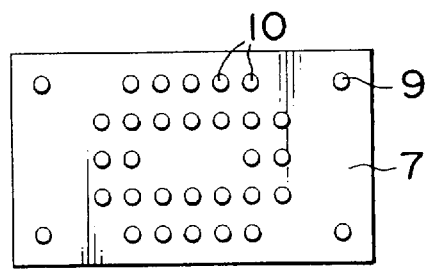
FIG. 9 is a bottom view showing another construction of principal portions of the semiconductor package according to the present invention.
Figure 10:
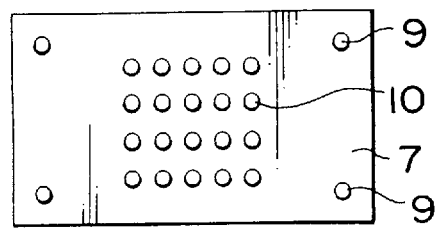
FIG. 10 is a bottom view showing another construction of principal portions of the semiconductor package according to the present invention.
Figure 11:
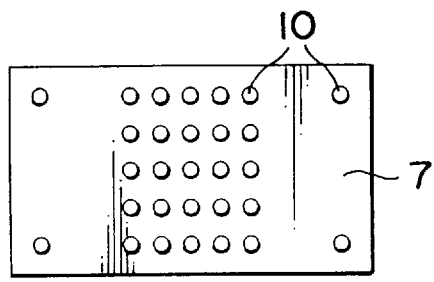
FIG. 11 is a bottom view showing another construction of principal portions of the semiconductor package according to the present invention.
Figure 12:
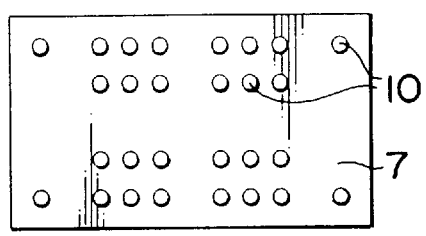
FIG. 12 is a bottom view showing another construction of principal portions of the semiconductor package according to the present invention.
Figure 13:
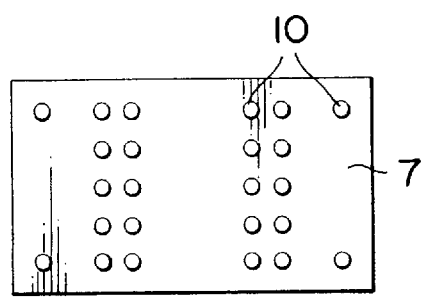
FIG. 13 is a bottom view showing another construction of principal portions of the semiconductor package according to the present invention.

The flat type external connecting terminals formed on the rear surface of the board with constant pitches in a lattice shape may be arranged as shown in FIGS. 5 to 13. In FIG. 5, the outer tolerance of the external connecting terminals is relatively large. In FIGS. 6 and 7, the external connecting terminals are formed at other than the center portion of the board. In FIGS. 8, 9, and 10, the external connecting terminals are formed at the center portion of the board and dummy external connecting terminals 9' are formed at corner portions of the board. In FIG. 11, the external connecting terminals are formed at the center portions and corner portion of the board. In FIGS. 12 and 13, the external connecting terminals are formed at the center portion of the board as blocks and at the corner portions of the board. In other words, the flat type external connecting terminals are formed with constant pitches in a lattice shape. However, depending on the number of external connecting terminals, the arrangement thereof can be freely selected. When the height of the rear surface of the board is kept constant, the reliability of the connections can be further improved. When the dummy external connecting terminals 9' are formed at regions free from the external connecting terminals (these regions include at least corner portions), since the height of the rear surface of the board is kept constant, the external connecting terminals 9 can be equally contacted with the circuit board. As long as the flat type external connecting terminals are formed with constant pitches in a lattice shape, the semiconductor chip can be tested through a standard semiconductor socket. In other words, since the terminal pins are formed with constant pitches in a lattice shape and a standard semiconductor socket with terminal pins that have elasticity, the semiconductor package can be tested. The dummy external connecting terminals 9' may be formed outside the lattice arrangement with constant pitches.

According to the construction of the above-described semiconductor package, when the thickness of the board 7 is in the range from 0.2 to 0.25 mm, the thickness of the semiconductor chip is in the range from 0.25 to 0.3 mm, and the gap between the board 7 and the semiconductor chip is 0.03 mm, a semiconductor package with a thickness of 0.5 to 0.6 mm can be accomplished.

As described above, according to the semiconductor package of the present invention, since so-called mold resin layer is omitted, at least the thickness thereof can be reduced. In addition, since the reliability of the characteristics and functions of the semiconductor package are improved, the semiconductor package can be suitable used for a functional part of a portable apparatus such as a card type apparatus. Since the thickness of the semiconductor package can be reduced, the resin type board and the semiconductor chip (IC chip) mounted thereon can be selected from a variety of types. Thus, since the characteristics and functions can be widely selected, the applications of the semiconductor package according to the present invention can be widened. In addition, since the external connecting terminals are formed on the rear surface of the board with constant pitches in a lattice shape, as long as connecting terminals of a semiconductor socket and a mounting circuit board are formed with such constant pitches in such a lattice shape, they can be electrically connected.

When a semiconductor chip is connected corresponding to the conventional wire bonding process, the positions of electrode pads are not freely selected. On the other hand, according to the semiconductor package of the present invention, the positions of the electrode pads of the semiconductor chip can be freely selected. Even if the semiconductor package has been sealed with resin, since a semiconductor chip therein can be burnt in. Thus, by mounting the semiconductor package on a board or the like, a repair work for a defective chip is not necessary. Thus, circuit apparatus with a high reliability can be accomplished. Consequently, the semiconductor package according to the present invention can revolutionarily change the design conception of the semiconductor chips.

In addition, according to the fabrication method for fabricating a semiconductor package of the present invention, a semiconductor package with the above-described excellent functions can be quantitatively fabricated with high yield. Thus, the fabrication method according to the present invention provides many practical advantages along with low cost.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A semiconductor package, comprising:
   a circuit board having first and second surfaces and having a wiring circuit including a connecting portion on the first surface;
   a semiconductor chip having first and second surfaces and mounted face-down with the first surface thereof confronting the first surface of the circuit board;
   a sealing resin layer formed between the first surface of the semiconductor chip and the first surface of the circuit board; and
   a plurality of flat external connecting terminals electrically connected to the semiconductor chip and formed on the second surface of the circuit board,
   wherein the plurality of flat external connecting terminals are arranged with constant pitches in a lattice shape so that standard sockets for testing the semiconductor chip can be used, the plurality of external connecting terminals being formed on the second surface of the circuit board according to:

$$m = INT[(h-2f)/a] + 1,$$

$$n = INT[(v-2f)/a] + 1,$$

where h is a width of the circuit board, v is a length of the circuit board, a is the pitch of the external connecting terminals, f is a distance between a center of the an outermost external connecting terminal and a corresponding edge of the circuit board, m is a number of external connecting terminals in a width direction of the circuit board, and n is a number of external connecting terminals in a length direction of the circuit board.

2. The semiconductor package according to claim 1, wherein the plurality of flat external connecting terminals are divided into a plurality of regions.

3. The semiconductor package according to claim 1, further comprising a plurality of dummy connecting terminals for keeping a height of the second surface of the circuit board constant.

4. The semiconductor package according to claim 3, wherein the dummy connecting terminals are provided at corner portions of the second surface of the circuit board.

5. The semiconductor package according to claim 1, further comprising a plurality of dummy connecting terminals formed on regions of the second surface of the circuit board including at least corner portions outside the lattice shape of the plurality of external connecting terminals.

6. The semiconductor package according to claim 1, wherein a length of the circuit board is approximately 11.2 mm and a width of the circuit board is approximately 6.6 mm.

* * * * *

UNITED STATES PATENT AND TRADEMARK OFFICE
CERTIFICATE OF CORRECTION

PATENT NO. : 5,814,890
DATED : September 29, 1998
INVENTOR(S) : Iwasaki

It is certified that error appears in the above-indentified patent and that said Letters Patent is hereby corrected as shown below:

Claim 1, Column 9, line 6, after "center of" delete "the".

Claim 4, Column 10, line 5, "comer" should read --corner--.

Claim 5, Column 10, line 9, "comer" should read --corner--.

Signed and Sealed this

Third Day of April, 2001

Attest:

NICHOLAS P. GODICI

*Attesting Officer*     Acting Director of the United States Patent and Trademark Office